US008422293B2

(12) United States Patent
Kamp et al.

(10) Patent No.: US 8,422,293 B2
(45) Date of Patent: Apr. 16, 2013

(54) SELF-POWERED EVENT DETECTION DEVICE

(75) Inventors: David A. Kamp, Monument, CO (US); Filippo Marinelli, Lussy-sur-Morges (CH); Thierry Roz, Payerne (CH)

(73) Assignee: EM Microelectronic-Marin SA, Marin (CH)

( * ) Notice: Subject to any disclaimer, the term of this patent is extended or adjusted under 35 U.S.C. 154(b) by 140 days.

(21) Appl. No.: 12/945,138

(22) Filed: Nov. 12, 2010

(65) Prior Publication Data

US 2011/0115548 A1 May 19, 2011

Related U.S. Application Data

(63) Continuation-in-part of application No. 12/620,365, filed on Nov. 17, 2009, now abandoned.

(30) Foreign Application Priority Data

Nov. 12, 2009 (EP) .................................... 09175792

(51) Int. Cl.
*G11C 16/22* (2006.01)

(52) U.S. Cl.
USPC ............ 365/185.04; 365/185.21; 365/185.23; 365/227; 365/228

(58) Field of Classification Search .................. 365/227, 365/228, 229, 226, 185.02, 185.04, 185.21, 365/185.23
See application file for complete search history.

(56) References Cited

U.S. PATENT DOCUMENTS 5,317,303 A 5/1994 Ross et al.
6,046,676 A 4/2000 Ward et al.
(Continued)

FOREIGN PATENT DOCUMENTS

EP 0 592 097 A2 4/1994
EP 2 325 818 A1 5/2011
WO 94/10686 5/1994
WO 01/45139 A2 6/2001

OTHER PUBLICATIONS

European Search Report issued in related application EP10 19 1110 on Mar. 28, 2011.

(Continued)

*Primary Examiner* — Andrew Q Tran
(74) *Attorney, Agent, or Firm* — Griffin & Szipl, P.C.

(57) ABSTRACT

The self-powered detection device comprises a non-volatile memory cell and a sensor activated by a physical or chemical action or phenomenon, this sensor forming an energy harvester transforming energy from the physical or chemical action orphenomenon into an electrical stimulus pulse, the memory cell arranged for storing, by using electrical power of the electrical stimulus pulse, at least a bit of information relative to detection by the sensor of at least a first physical or chemical action or phenomenon. The non-volatile memory cell comprises a FET transistor having a control gate, a first diffusion defining a first input and a second diffusion defining a second input. This FET transistor is set to its written logical state from its initial logical state when, in a detection mode, it receives on a set terminal a voltage stimulus signal resulting from the first physical or chemical action or phenomenon.

30 Claims, 8 Drawing Sheets

U.S. PATENT DOCUMENTS

| | | | | |
|---|---|---|---|---|
| 6,735,802 | B1 | 5/2004 | Lundell et al. | |
| 6,861,785 | B2 | 3/2005 | Andre et al. | |
| 8,154,387 | B2 * | 4/2012 | Van Eeden et al. | 340/10.2 |
| 2002/0190610 | A1 | 12/2002 | Andre et al. | |
| 2008/0174281 | A1 | 7/2008 | Shau | |
| 2009/0073760 | A1 | 3/2009 | Betser et al. | |
| 2009/0121837 | A1 | 5/2009 | Kitayoshi et al. | |
| 2011/0080775 | A1 | 4/2011 | Bae et al. | |
| 2011/0110171 | A1 * | 5/2011 | Kamp et al. | 365/189.16 |

OTHER PUBLICATIONS

Chan, T.Y. et al., "A True Single-Transistor Oxide-Nitride-Oxide EEPROM Device," IEEE Electron Device Letters, vol. EDL-8, No. 3, Mar. 3, 1987, pp. 93-95.

European Search Report issued in counterpart European Application No. 09175792, completed Apr. 20, 2010.

Notice of Allowance issued in co-pending related U.S. Appl. No. 12/945,168 on Sep. 4, 2012.

Office Action issued in abandoned parent U.S. Appl. No. 12/620,365 on Jan. 9, 2012.

Notice of Allowance issued in co-pending related U.S. Appl. No. 12/945,203 on Dec. 4, 2012.

* cited by examiner

SELF-POWERED EVENT DETECTION DEVICE

This application is a Continuation-in-Part of U.S. patent application Ser. No. 12/620,365, filed Nov. 17, 2009, now abandoned, which claims priority from European Patent Application No. 09175792.2, filed Nov. 12, 2009, the entire disclosures of which are incorporated herein by reference.

FIELD OF THE INVENTION

The present invention concerns a self-powered event detection device which comprises a sensor, activated by a physical or chemical action or phenomenon applied on it with at least a given strength or intensity, and a non-volatile memory for storing information relative to the detection of at least one physical or chemical action or phenomenon detected by said sensor. In particular, the present invention concerns a tamper event detection device for detecting a penetration in a protected zone or in a closed case or container.

By ‘self-powered event detection device’ it is understood that there is no need for an internal or external power source supplying the device for allowing its sensor to be activated and to detect a specific physical or chemical action or phenomenon. However, such a self-powered event detection device can be supplied with power for other functions in defined time periods, e.g. for reading the state of a memory or for resetting such a memory. In the following description of the invention, the physical or chemical action or phenomenon to which the sensor is sensitive is also named an external event. By ‘external event’ it is thus understood an action or a phenomenon that the sensor can detect, i.e. an action or a phenomenon applied on the sensing element of this sensor, and not an electrical signal from an external power source supplying the electronic circuit of such a sensor or a further electronic circuit associated to the sensor.

The invention further specifically deals with the reduction of the power consumption of such self-powered detection devices and furthermore with the increase in their security level. In particular, the invention concerns such self-powered detection devices comprising a read circuit or being arranged to be coupled to such a read circuit for reading the state of the NVM and, in a particular case wherein the self-powered detection device can be reset, further comprising a reset circuit or being arranged to be coupled to such a reset circuit.

BACKGROUND OF THE INVENTION

The detection of an attempt to recover secrets from/within a protected zone, a closed case or a container through the use of an electronic circuit is often implemented by mechanical means external and adjacent to the electronic circuit which permanently records the attempt by changing a physical structure of or related to this electronic circuit in a way not easily noticed by the perpetrator. This physical change can then be established by the fact that the electronic circuit is no longer functional or by measuring an electrical parameter of the electronic circuit that has been modified directly or indirectly by the mechanical means.

Another method for the detection of an external event consists of the integration of electrical detection means internal to the electronic circuit, powering this electronic circuit and waiting for the event to occur while powered. For example, the detection means can be a sensor that is configured to provide a detection signal when the sensor and the electronic circuit are powered, the occurrence of this signal being stored in a memory via a write control circuit which is also powered by a power source. Thus, the supply of power for the event detection device needs to be a battery or another power source supplying continuous power. Without such a power source or if the power source is OFF or if the energy stored in the battery becomes too low, this device will not be functional, i.e., it will be incapable of detecting and recording an event. It is indeed possible to limit the current consumption of such a detection device by implementing a ‘sleep mode’. However the detection device will be functional only when supplied. Furthermore, in the case of an internal power source like a battery, such a device will have a limited lifetime or the internal power source will have to be changed after a certain time period. This causes a security problem first because there is a risk that the detection device becomes no longer functional when an interruption of the power supply occurs, and secondly because a perpetrator could cause an interruption of the power source, stopping the electrical supply of the detection device during the time period of the attempt.

The patent application EP 0 592 097 proposes a penetration detection system which overcomes the above mentioned problem concerning the power supply. This detection system comprises a sensing piezoelectric transducer and a memorizing piezoelectric transducer. The positive pole and the negative pole of the sensing piezoelectric transducer are respectively connected to the negative and positive poles of the memorizing piezoelectric transducer. The memorizing transducer comprises a layer of piezoelectric material having a thickness selected such that, upon mechanical probing of the sensing transducer, an electrical signal produced by this sensing transducer will be sufficient to effect a reversal in the poling of the memorizing transducer. This system defines a self-powered detection device. However, this detection device is expensive and not well adapted to be integrated in a small volume device because it comprises two distinct piezoelectric transducers. As shown in this patent application, these two transducers form two separate discrete units which are electrically connected and the memorizing transducer is linked to other classical electronic elements which are not manufactured with a same technology as this memorizing transducer. Thus, an integration of the memorizing piezoelectric transducer with further electronic elements, e.g. a reading circuit, will not be possible with a classical microelectronic process. Further, the reading means are complex and not adapted to integrated circuits.

The patent application US 2002/0190610 describes a self-powered remote control device comprising transmitting means, a feeder circuit connected to said transmitting means, a generator supplying electric power connected to the feeder circuit, and control means associated with the electric power generator. The generator comprises at least a piezoelectric element receiving mechanical stresses produced by actuating the control means and supplying electrical power to the feeder circuit. The feeder circuit comprises a rectifier bridge and a feeder capacitor in which the electrical energy provided by the piezoelectric element is accumulated and stored. In a particular embodiment, the remote control device further comprises a data management circuit associated with a memory and a counting circuit. To be functional, such a remote control device must receive a high amount of electrical energy to be stored in the feeder capacitor. The feeder circuit itself consumes some electrical energy as well as all others circuits of this device. Thus, the piezoelectric element needs to be able to generate a relatively high amount of electrical energy and the control means have to be actuated with a relatively high force for generating such a high amount of electrical energy. This limits the potential applications of this remote control device. Further such a control device is complex and expensive.

SUMMARY OF THE INVENTION

A first aim of the invention is to provide a self-powered detection device comprising at least a non-volatile memory cell and a sensor which is activated by a physical or chemical action or phenomenon, in particular a tamper event, and which needs only a small amount of electrical energy for setting the non-volatile memory in a secure way, this small amount of electrical energy being provided by the sensor when it detects said physical or chemical action or phenomenon applied to it with at least a given strength or intensity. A further aim of the invention is to provide such a self-powered detection device at low cost and in a small volume.

Thus, the invention concerns a self-powered detection device comprising at least a non-volatile memory cell and a sensor which is activated by a physical or chemical action or phenomenon, this sensor forming an energy harvester that transforms energy from said physical or chemical action or phenomenon into an electrical stimulus pulse, the memory cell being arranged for storing, by using the electrical power of said electrical stimulus pulse, at least a bit of information relative to the detection by the sensor of at least a first physical or chemical action or phenomenon applied to it with at least a given strength or intensity. This detection device is characterized in that the non-volatile memory cell is formed by a FET transistor having a control gate, a first diffusion defining a first input and a second diffusion defining a second input, and in that this FET transistor is set to its written logical state from its initial logical state when, in a detection mode of this self-powered detection device, it receives on a set terminal, among said control gate and said first and second inputs, a voltage stimulus signal resulting from the first physical or chemical action or phenomenon.

In a first embodiment of the invention, the set terminal of the FET transistor is its control gate and the first input of this FET transistor is connected to the ground of the sensor in said detection mode.

In a further embodiment of the invention, the set terminal of the FET transistor is its first input and the control gate of this FET transistor is connected to the ground of the sensor in said detection mode.

In a first main variant of the invention, the FET transistor is of the 'floating gate' type with a tunnel oxide over the drain diffusion and said first input of this FET transistor is its drain. In a second main variant of the invention, the FET transistor is of the 'floating gate' type with a tunnel oxide over the channel zone or of the SONOS type. In this case said first input of the FET transistor is its drain or its source.

In a preferred embodiment of the invention, the self-powered detection device comprises reading means of the non-volatile memory cell or is arranged to be coupled to such reading means which are active when powered by a power source, these reading means being, in a read mode, electrically connected to said first input or said second input of the FET transistor and arranged for detecting the state of this non-volatile memory cell by sensing the level of an electrical current flowing through this first or second input. In a preferred variant, the reading means are formed by a latch providing at its output a logical signal relative to the state of the FET transistor.

In a particular variant of the above-mentioned first main variant, the detection device further comprises reset means or is arranged to be coupled to such reset means for resetting the non-volatile memory cell, these reset means being, in a reset mode, arranged to reset the FET transistor by applying a voltage signal of inversed polarity, relatively to the voltage stimulus signal, between the control gate and the first input of this FET transistor.

In a particular variant of the above-mentioned second main variant, the detection device further comprises reset means or is arranged to be coupled to such reset means for resetting the non-volatile memory cell, these reset means being, in a reset mode, arranged to reset the FET transistor by applying a voltage signal of inversed polarity, relatively to the voltage stimulus signal, between the control gate and the first input or the second input of this FET transistor.

In a preferred variant of the above-mentioned preferred embodiment, an isolation circuit is provided between the FET transistor and the reading means, this isolation circuit being arranged for isolating this FET transistor from these reading means in said detection mode but for connecting them in said read mode.

In a preferred variant of the above-mentioned first embodiment, the detection device further comprises a switch arranged between the ground of the sensor and the first input of the FET transistor. This switch has its control gate connected to the set terminal of this FET transistor so that it is turned on when a voltage stimulus signal is provided to this set terminal of the FET transistor thereby connecting its first input to ground.

In a preferred variant of the above-mentioned second embodiment, the detection device further comprises a switch arranged between the ground of the sensor and the control gate of the FET transistor. This switch has its control gate connected to the control gate of this FET transistor so that it is turned on when a voltage stimulus signal is provided to this control gate of the FET transistor thereby connecting its control gate to ground.

In a particular variant, the switch is formed by a second FET transistor which control gate is connected to the set terminal of the above-mentioned FET transistor (first FET transistor).

In the case where the memory cell can not be reset, the non-volatile storage cell can be for example One-Time-Programmable (OTP). In the case where the memory cell can be reset, the non-volatile storage cell can be for example Flash, EPROM or EEPROM, this list being non-exhaustive.

It is to be noted that, in a specific embodiment of the invention, the sensor (or a part of this sensor, e.g. its circuitry) and an electronic circuit incorporating the non-volatile memory can be integrated or incorporated in a unique electronic unit.

According to the invention, an energy harvester transforms the detected external event into electrical energy which is used to supply the electronic means arranged for storing the fact (setting a flag) that such an external event occurs. Here is a non-exhaustive list of the possible external events and related harvesters:

Electrical event: Electrostatic discharge;
Mechanical event: Piezoelectric element, dynamo;
Light event: Photodiode(s), solar cell(s);
Chemical event: Battery (detection of the mixing of ions);
Heat event: Thermopile;
Electromagnetic event: Antenna, rectifier, solenoid;
Pressure event: Barometer unit.

BRIEF DESCRIPTION OF THE DRAWINGS

Other features and advantages of the present invention will appear more clearly from the following detailed description of illustrative embodiments of the detection device according to the invention, given by way of non-limiting examples, in conjunction with the drawings in which.

DETAILED DESCRIPTION OF EMBODIMENTS OF THE INVENTION

Figure 1:
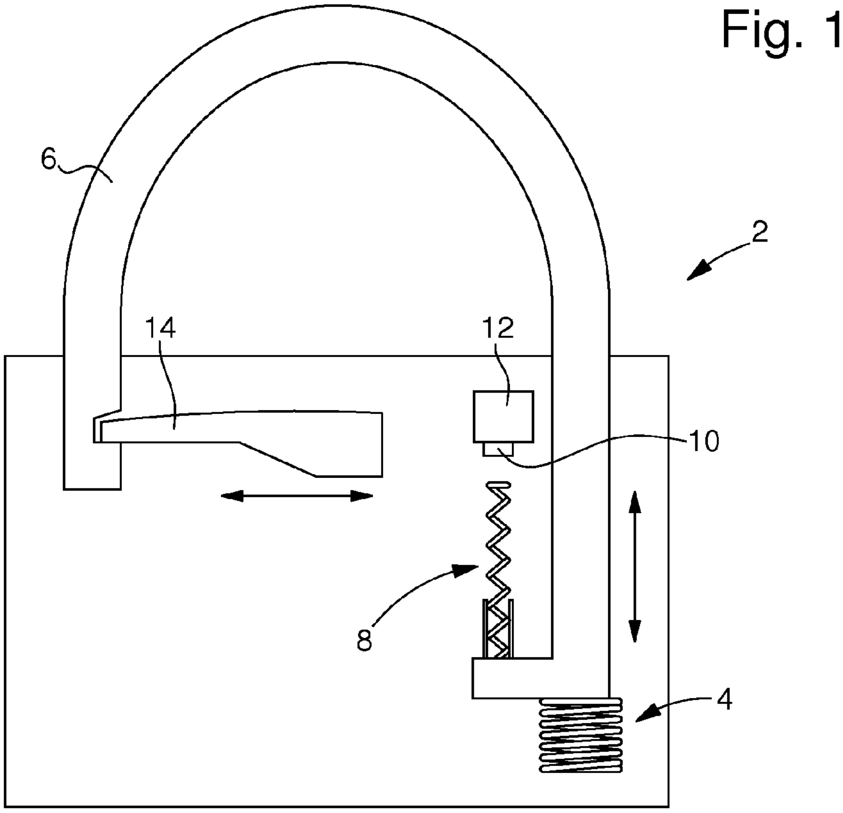
FIG. 1 shows a lock with a self-powered detection device according to the invention.

FIG. 1 shows schematically a lock 2, represented in its closed state, equipped with an external event detection device which comprises a sensor 10 and an electronic unit 12 according to the present invention. In this application, the sensor is formed by a piezoelectric element and associated circuitry arranged for providing an electrical power signal to the electronic unit when a certain pressure is applied on the piezoelectric element. This electrical power signal will be named '(electrical) stimulus signal' in the present description of the invention. In other words, the sensor 10 defines an energy harvester according to the present invention. This sensor transforms energy from an external event applied on it into electrical energy contained in an electrical stimulus pulse that forms an electrical stimulus signal provided to the electronic unit.

The aim of this detection device is to detect if a tamper event has occurred in a zone or in a case or container protected by this lock. If the lock is forced, i.e. tampered with, the spring 4 will push up the piece 6 and the spring 8 will apply a force on the piezoelectric element with at least a given strength or intensity. This external event is stored in a memory part of the detection device. Before opening the lock, an authorized user will have to first read the memory to know if a tamper event has occurred.

Figure 2:
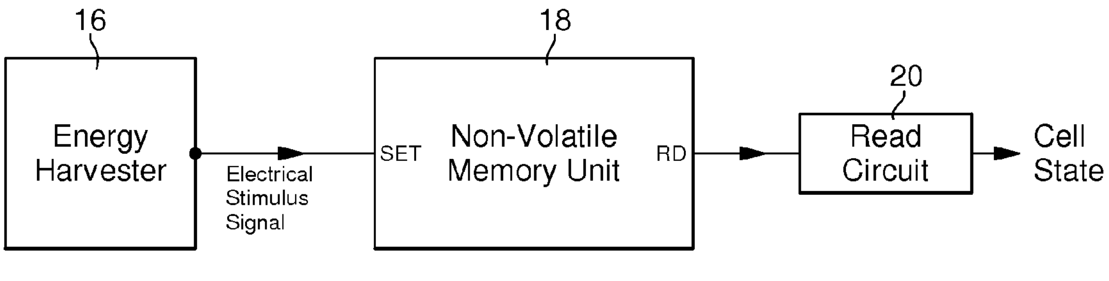
FIG. 2 shows the basic architecture of a first embodiment of the external event detection device according to the invention.

FIG. 2 shows the basic architecture of a first embodiment of the external event detection device according to the invention. The DC electrical energy of an external event is collected by the sensor forming an energy harvester 16 and provided to a memory part of the electronic unit, formed by a Non-Volatile Memory (NVM) unit 18 comprising at least one NVM cell, through an electrical stimulus signal line (set line). In the case of the lock of FIG. 1, this energy is provided by the force applied by the spring 8 on the piezoelectric element of the sensor 10. The memory part 18 is arranged for storing at least a bit of information or an item of data relative to at least one external event detected by the external event sensor 16. According to the invention, the electronic unit is arranged for storing said data by substantially using only the electrical energy contained in the electrical stimulus pulse generated by the external event acting on the sensor. Thus, the detection device of FIG. 2 defines a self-powered detection device. This is also the case for all other embodiments of the invention that will be further described.

The electrical energy that the energy harvester (piezoelectric element and associated circuitry in the case of FIG. 1) has to give is the energy needed to raise the voltage on the input capacitance of the electronic unit corresponding to the switching voltage plus the energy needed to switch the NVM cell formed by a FET transistor and lost energy, i.e.:

Energy needed to raise the voltage on the input capacitance:

$$E_r = \frac{1}{2} C_{input} V_{sw}^2$$

where $C_{input}$ is the input capacitance $V_{sw}$ is the switching voltage

Typically, for an EEPROM technology:

$$E_r = \frac{1}{2}(20\ \text{pF})(16\ \text{V})^2 = 2.6\ \text{nJ}$$

Energy needed to switch the cell:

$$E_s = I_{sw} T_{sw} V_{sw}$$

where $I_{sw}$ is the switching current $T_{sw}$ is the switching time

Typically, for an EEPROM technology:

$$E_s = (100\ \text{nA})(5\ \text{ms})(16\text{V}) = 8\ \text{nJ}$$

So the total electrical energy needed to store a bit of information or an item of data in one FET transistor is typically of the order of 10 nJ.

For example, the piezoelectric element "PIC 151" (ceramic PZT), sold by the German company Physik Instrumente (PI), can be used to produce the needed energy and voltage to set a flag in the NVM cell. With an Input capacitance of 20 pF, 10 nJ can be generated by such a piezoelectric element having a capacity $C_{PZT}$ of approximately 19 pF, with a voltage value of approximately 16 V across this Input capacitance, by applying a force of about 1.25 N on the piezoelectric element. It is possible to generate more than 10 nJ, for instance 20 nJ with such a piezoelectric element by increasing the applied force. If needed, a force amplifier can be arranged between the piezoelectric element and the spring (i.e. the element generating an external force used by the energy harvester when an external event occurs). In case the piezoelectric element would generate a voltage significantly greater than the needed switching voltage for the memory cell, a protection element or circuit can be added between the piezoelectric element and the electronic unit or in an input part of such an electronic unit.

The electronic unit further comprises a readout circuit 20 allowing, when powered, the reading of the logical state of the NVM cell 18. The read circuit is only used during the reading phase (so only when the circuit is supplied). The read circuit is designed so that it will not interfere with the setting of the memory cell (whether the power supply is present or not). When the device is supplied, the read circuit will enable a read of the non-volatile memory cell and the output of the read circuit will return, e.g., a logical '0' if no tamper event occurred and a logical '1' if a tamper event has occurred. Since this circuit is here not resettable, it can detect only one tamper event.

Figure 3:
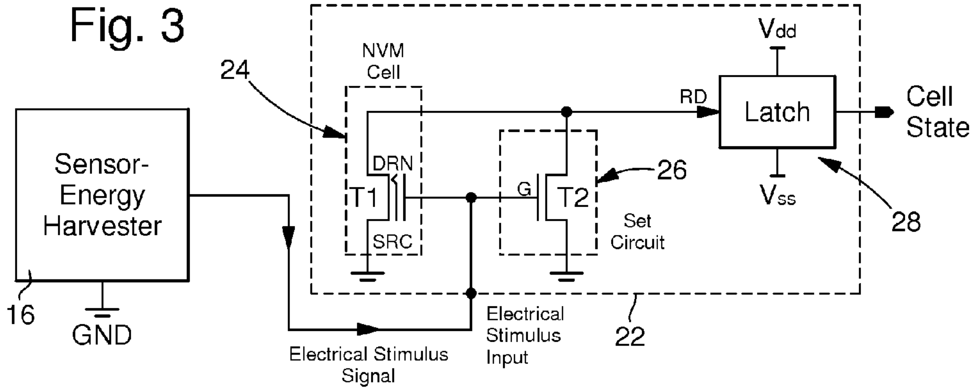
FIG. 3 shows a variant of the electronic design of the first embodiment.

FIG. 3 shows a preferred electronic design of the previously described first embodiment. The non-volatile memory cell 24 is directly set to its written logical state from its initial logical state by an electrical stimulus pulse provided by the energy harvester (sensor) 16. The NVM cell 24 is formed by a first FET transistor T1 having a control gate, a source region SRC and a drain region DRN. The control gate is connected to a stimulus input of the electronic unit 22 receiving the electrical stimulus pulse/signal of said energy harvester. The ground of the electronic unit 22 is defined by the energy harvester/sensor which ground line (not represented) is connected to this electronic unit.

The electronic unit 22 further comprises a set circuit 26 defining a switch arranged between the ground of the electronic unit and the drain DRN of the first FET transistor. This switch is preferably formed by a second FET transistor T2 having a control gate connected to the electrical stimulus input and is turned on when an electrical stimulus pulse is provided to the electronic unit, connecting the drain of the first FET transistor to ground (0 V) and thus allowing the secure setting of the non-volatile memory cell 24 to the logical '1' state.

The electronic unit 22 comprises reading means of said non-volatile memory cell which is active only when supplied by a power source. This reading means is formed by a latch 28 having its input connected to the drain DRN of said first FET transistor and automatically providing at its output, when a power supply is applied by an external device/reader, a signal indicating the state of the NVM cell.

Figure 4:
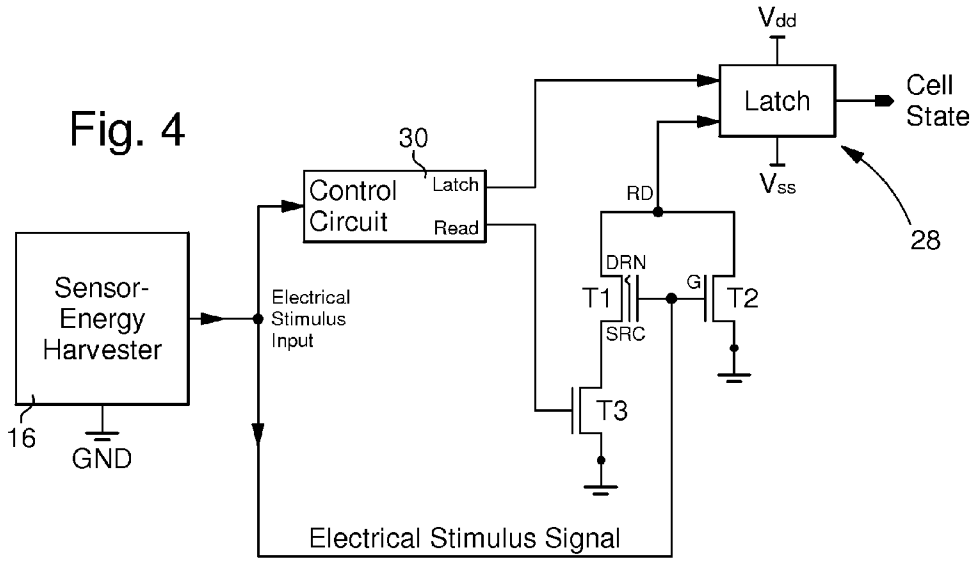
FIG. 4 shows a second embodiment of the external event detection device according to the invention.

FIG. 4 shows a second embodiment of the self-powered detection device according to the invention. This second embodiment also concerns a variant without reset and further comprises in the electronic unit a control circuit 30 and a third FET transistor T3 controlled by this control circuit and arranged between the ground of the electronic unit and the source of the first FET transistor. The control circuit also controls the latch so as to disconnect this latch from the drain of the memory transistor T1 when an electrical stimulus pulse is provided to the electrical stimulus input.

The operation of this implementation can be summarized as follows:

A) Following fabrication, the memory transistor T1 is in the non-tampered state (e.g. conductive state);

B) Power is applied and thus the transistor T3 is turned ON, the non-tampered state being so written into the Latch 28, which drives its output to the logic low voltage level (this step is provided in a preferred implementation to secure the initial state of the Latch);

C) The circuit is deployed without power supply (no electrical power source);

D) A tamper event occurs supplying an electrical stimulus pulse to the electrical Stimulus Input of the electronic unit. The transistor T2 turns ON thus grounding the drain DRN of the transistor T1 and the transistor T3 is turned OFF because there is no power for control circuit 30 to drive the gate of T3. The transistor T1 is thus set to its tampered state (non-conductive state) by the power of the stimulus pulse itself;

E) Power is again supplied to the circuit. The transistor T3 is turned on, and the set state is written into the Latch, which drives its output to the logical '1', or high voltage, level (external event detected).

Figure 5:
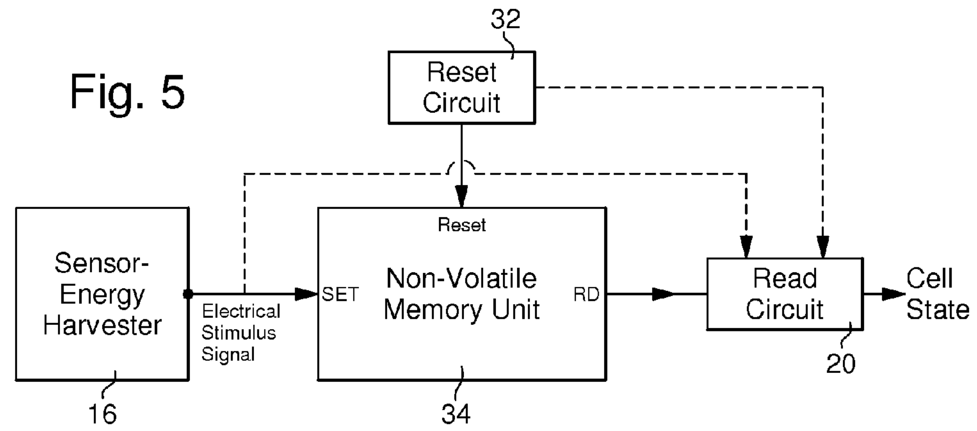
FIG. 5 shows the basic architecture of a third embodiment of the external event detection device according to the invention.

FIG. 5 shows the basic architecture of a third embodiment of the self-powered detection device according to the invention. In this third embodiment, the electronic unit comprises reset means for resetting the non-volatile memory cell.

The electrical energy of the external event is collected at the electrical stimulus input of the electronic unit and, as in the previous embodiments, a corresponding data is written in the NVM cell 34. This NVM cell has a reset input receiving a reset signal from a reset circuit 32. This reset circuit needs to be power supplied for resetting the memory cell.

When power is supplied is present, the reset circuit allows resetting the non-volatile memory cell after an external event has been detected and this cell set. This allows reuse of the external event detector after one detected external event. Let us consider the case of a security device in which the detection device according to this embodiment has been tampered with. When the detection device is supplied following a tamper event, the read circuit will enable a read of the non-volatile memory cell and the read output will be a logical '1'. Once this tamper event has been acknowledged, the user can reset the non-volatile memory cell through the reset circuit 32.

The reset circuit and the read circuit are only used when the detection device is supplied by a power source. These elements are preferably designed so that they will not interfere with the setting of the memory cell during a tamper event (whether the supply is present or not).

Figure 6:
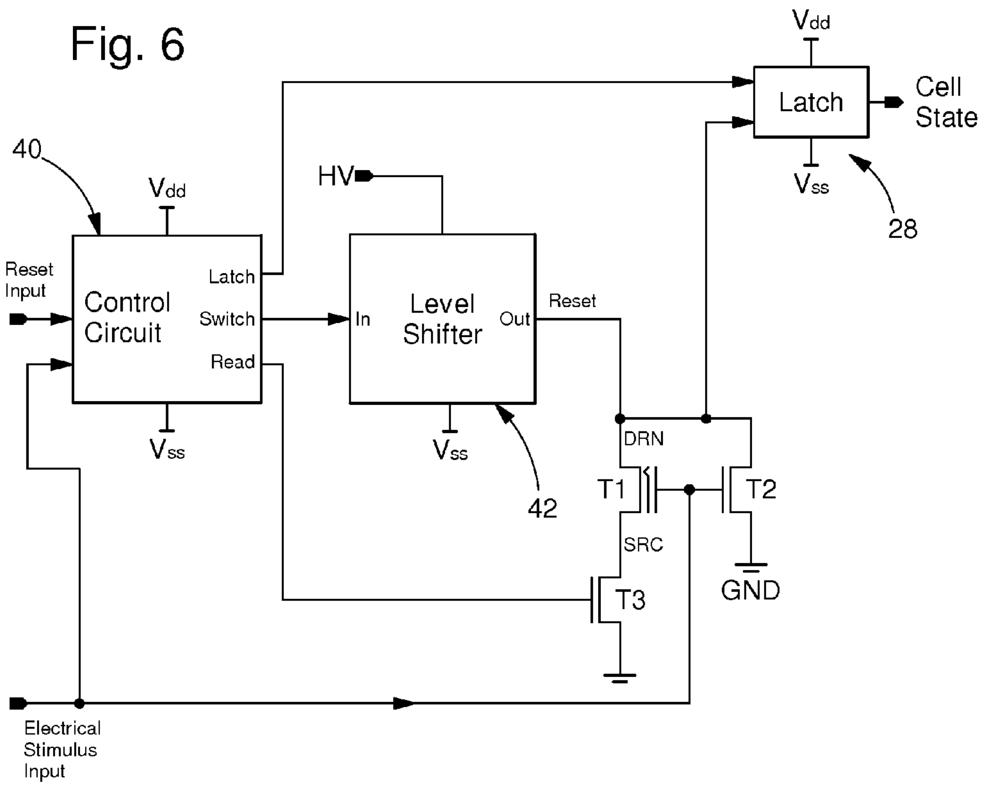
FIG. 6 partially shows a variant of the electronic design of the third embodiment.

FIG. 6 shows a preferred electronic design of the third embodiment. The reset circuit is formed by a control circuit 40 and a level shifter 42 receiving a High Voltage (HV). The level shifter is controlled by the control circuit 40. In a variant, the level shifter can be formed by a high voltage inverter (CMOS Inverter). When the detection device is supplied, the latch 28 will automatically have a logical state corresponding to the logical state of the memory transistor T1. If this transistor T1 is set, the user takes note that a given external event has been detected. Then, the user can reset the memory cell so as to reuse the detection device. When a reset signal is received at the reset input of the control circuit 40, then the outputs of this control circuit are switched as follows:

- The latch output is driven to 0 V instructing the latch to turn OFF for protecting itself from the high voltage which will be applied to the drain DRN of transistor T1;
- The read output is driven to 0 V, turning OFF transistor T3 and thus disconnecting the source SRC of transistor T1 from ground;
- The switch output is driven high to the power supply level and thus the level shifter 42 provides at its output a High Voltage signal for erasing the memory cell which returns to its non-tampered state.

After the reset step has been terminated, the level shifter output is turned OFF (high impedance so that it is not driven), the latch output is driven high and the read output is driven high again. Thus, the latch will then also be reset by the voltage level of the drain of memory cell T1. Then, the power supply can be removed and the detection device is again reusable as a self-powered detection device.

Figure 7:
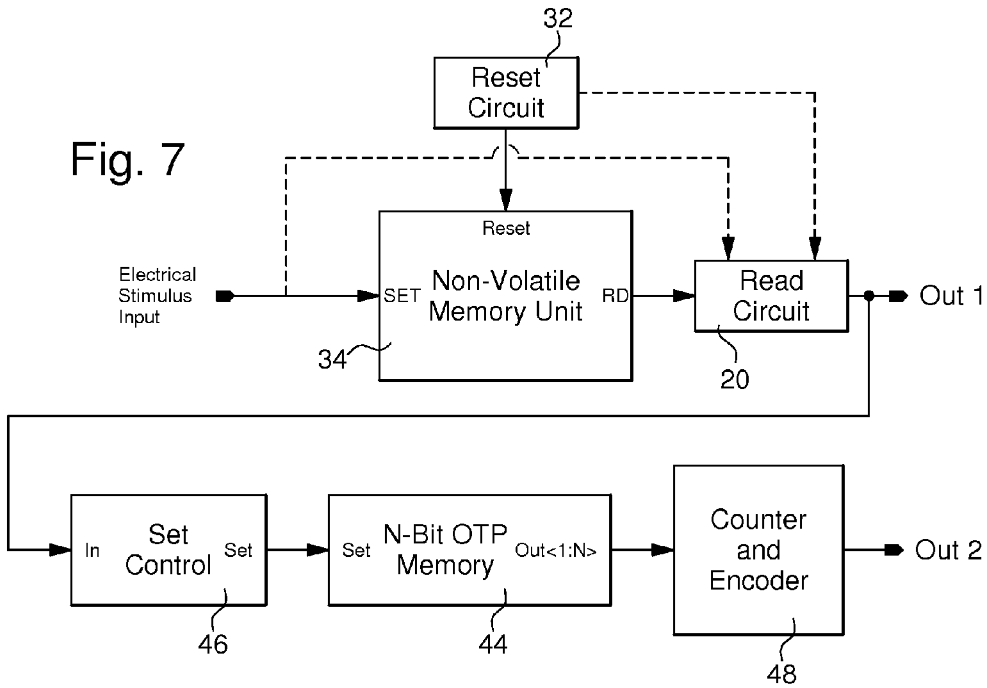
FIG. 7 partially shows the architecture of a fourth embodiment of the external event detection device according to the invention.

FIG. 7 shows the architecture of a fourth embodiment of the self-powered detection device according to the invention. This FIG. 7 is a block diagram of a resettable external event detector with a multi-Bit One-Time-Programmable (OTP) back-up storage. The aim of this improvement is to have a higher security level. A perpetrator or hacker could be able to reset the detection device according to the third embodiment previously described with sophisticated electronic means. In such a case, the tamper event will no longer be stored in the detection device. To overcome such a possible situation, the fourth embodiment is characterized in that the electronic unit further comprises a One-Time-Programmable memory (OTP Memory), a bit of which is automatically written when this electronic unit is powered and the non-volatile memory cell is in the written/tampered state.

In the variant represented in FIG. 7, the OTP memory 44 comprises several Bits (N Bits). When the detection device is supplied with power, the read circuit 20 provides at its output the logical state of the NVM cell 34. The set control circuit 46 determines if this logical state corresponds to a set state. If this is the case, the set control circuit will set a Bit of the N-Bit OTP memory 44 which is not already set. Preferably, the Bits of the OTP memory are successively set each time the non-volatile memory cell is set after a reset action, until all Bits of this OTP memory are set. A Counter and Encoder circuit 48 counts the number of set Bits in the OTP memory and provides the result in a coded format.

The operation of the detection device of FIG. 7 can be summarized as follows:

A) Power is supplied to the detection device. The NVM Cell is reset to its reset state (e.g. conductive state), and this reset state is indicated at Out 1 (e.g. as a logic low voltage level);

B) The number of set Bits in the OTP memory is read at Out 2 (if not already done before). This number has to be stored in an external device for comparison with a further result obtained the next time the detection device is checked;

C) The circuit is deployed without power supplied;

D) A tamper event occurs generating an electrical stimulus pulse provided at the electrical stimulus input;

E) The NVM Cell is set to its tampered state;

F) Power is supplied to the circuit;

G) The set state is read at output Out1 (e.g., as a logical '1' or high voltage level);

H) The set control circuit drives the Set input of the N-Bit OTP Memory for programming the first or next Bit of its N Bits to the set state;

I) This set state is then read by the counter and encoder circuit, which outputs an encoded group of bits representing how many bits within the N-Bit memory are set.

Steps A) through I) can be repeated up to an additional N−1 times.

In a variant, the OTP memory is set at the same time that the NVM memory is set by a detected external event. This variant however requires more energy in the electrical stimulus pulse. Thus, to automatically write the OTP memory only when the electronic unit is supplied is advantageous for the powerless detection device of the present invention.

Figure 8:
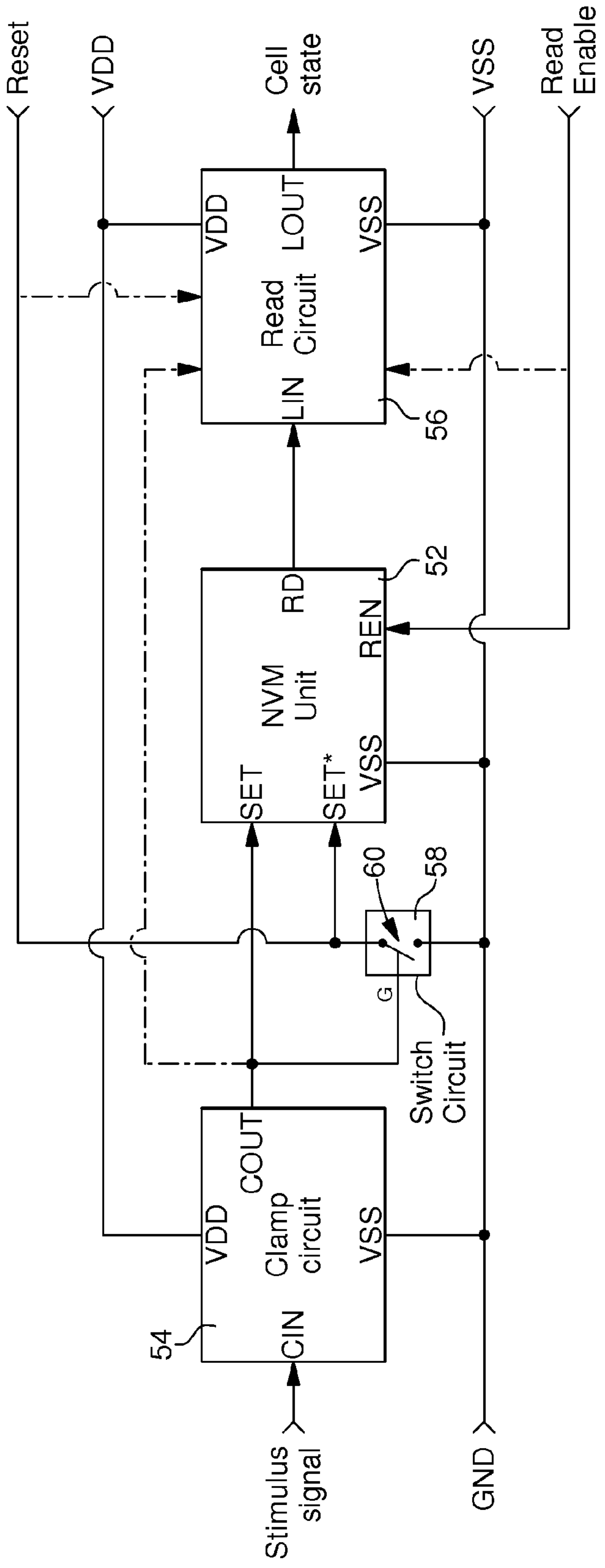
FIG. 8 partially shows the general architecture of a self-powered detection device according to the invention with a NVM unit which can have different arrangements according to the FIGS. 11 to 17.

In the following part of the description, further embodiments of the invention as well as different variants of the embodiments already described and of these further embodiments will be described. FIG. 8 show partially a general architecture of a self-powered detection device according to the present invention on the basis of which these further embodiments and variants will be described. The sensor/energy harvester is not represented in this FIG. 8, only two lines coming from such a sensor/energy harvester are shown. These two lines define two inputs of the electronic circuit of FIG. 8, of which the first one receives a voltage stimulus signal from the sensor when it is activated and the second one is connected to the ground (GND) of this sensor. These two inputs are those used in a detection mode of the self-powered detection device wherein no other supply source than the sensor is used for detecting at least one physical or chemical action or phenomenon applied to this sensor with at least a given strength or intensity, the electrical energy of an electrical stimulus pulse generated by such a physical or chemical action or phenomenon applied on the sensor being used.

The voltage stimulus signal resulting from the electrical stimulus pulse is transferred to the electronic circuit of FIG. 8 and used to set/write at least a NVM cell of the NVM unit 52. NVM unit 52 is arranged for storing in said NVM cell a bit of information relative to the detection by the sensor, during a detection mode of the self-powered detection device, of at least one physical or chemical action or phenomenon applied to it with at least a given strength or intensity and resulting in a voltage stimulus signal provided between a set control terminal SET and a base terminal SET * of the NVM unit 52 with at least a given set voltage. Thus, in the detection mode, the voltage stimulus signal generated by a physical or chemical action or phenomenon applied to the sensor passes through the clamp circuit 54 and is provided to the SET input of the NVM unit 52. As in the other embodiments, the detection device of FIG. 8 comprises a read circuit 56 which is formed in a preferred variant by a latch already described.

Clamp circuit 54 allows only a stimulus pulse with a predefined polarity to pass from its input CIN to its output COUT such that once a physical or chemical action or phenomenon, in particular a tamper event, is detected by the sensor, the record of this detection cannot be undone via the input CIN receiving the voltage stimulus signal. This protection is very interesting for tamper event detection because the input CIN, without such a clamp circuit, could be used by a tamperer for erasing the NVM cell, which has stored such a tamper event, by sending with an external device an electrical pulse with an inverse polarity relative to the polarity of the stimulus pulses generated by the sensor.

The self-powered detection device of FIG. 8 comprises a switch circuit 58 formed at least by a switch 60 arranged in the path between the ground GND of the sensor and the base terminal SET * of the NVM unit 52, the control gate G of this switch circuit being electrically connected to the set control terminal SET at least in the detection mode. It is to be noted that, in a variant not represented, the gate G of the switch circuit 58 can be disconnected from the SET terminal in other modes of the detection device (e.g. reset mode or read mode). The switch 60 is selected so as to be ON when the control gate G of the switch circuit 58 receives a voltage stimulus signal from the sensor with at least said given set voltage. Thus, in this case, the switch connects the base terminal SET * to GND (ground of the sensor) so that the voltage applied between the terminals SET and SET * of the NVM unit corresponds substantially to the whole voltage of the voltage stimulus signal, which ensures the setting of the at least one NVM cell in the NVM unit 52. The switch circuit is important for the detection device because it allows the implementation of further functions in an efficient way, in particular for reading the state of the NVM cell or for resetting it, where the base input SET * is used for such functions and must thus be disconnected from the ground of the sensor or the VSS terminal of a supply source intervening for such functions. The switch circuit 58 can in a variant be formed by a single switch element 60, in particular a transistor T2 as shown in FIGS. 3, 4 and 6 and already described. Thus, hereafter, the switch 60 is also named 'transistor T2' or simply 'T2', but should not be interpreted as a limitation.

During a detection mode (without power supply), the voltage stimulus signal is routed to input SET of the Non-Volatile Memory (NVM) unit 52. Simultaneously, switch 60/transistor T2 is turned on driving input SET * to the same potential as GND (0V). A NVM cell within the NVM unit 52 is then written to the "set" data state (flag). In the read mode of the self-powered detection device wherein at least the read circuit 56 is powered by a temporary power source, for reading out the cell state, the input REN 'Read Enable' is driven high turning on a path for current to flow through output RD (Read output of the NVM unit). A high current represents one cell state of two possible cell states while a low current represents the other of the two cell states. The read circuit, in particular a Latch as shown in FIGS. 3, 4 and 6, senses the amount of current and drives output LOUT to either a logical one or a logical zero level. In a reset mode of the self-powered detection device wherein at least the reset circuit is powered by a temporary power source, for resetting the NVM cell, the input SET * of the NVM unit 52 is driven high under user control (through a reset circuit not shown) while COUT of the Clamp circuit 54 is driven low in order to put switch 60 (transistor T2) in its OFF state and thus to ensure that the SET * terminal is disconnected from GND, respectively from VSS of the power source. In FIG. 8, the switch circuit 58 is connected to GND of the sensor and also to VSS of a temporary power source used in the read mode and the reset mode. In a variant, this switch circuit is connected only to GND and not to VSS.

Figure 9:
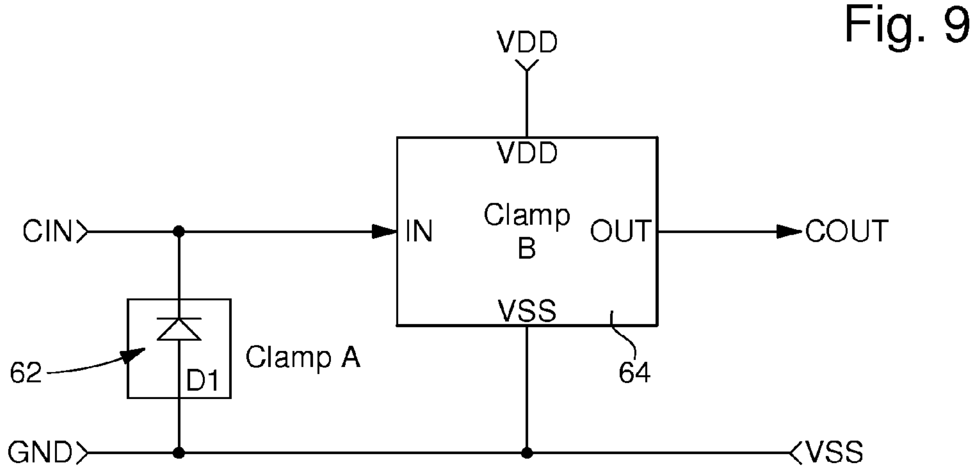
FIG. 9 shows a variant of a clamp circuit arranged between the sensor of the self-powered detection device and the NVM unit.

FIG. 9 is an example implementation of a clamp circuit. In this example, there are two subcircuits 62 and 64, respectively Clamp A and Clamp B. Clamp A is a negative clamp, which prevents the stimulus input from going negative with respect to VSS by more than one diode voltage drop (~0.6V) with or without the device being supplied. Without a negative clamp, a tamperer could allow a stimulus pulse to be emitted by the sensor to set the NVM cell (when this tamperer opens a protected device or enters a protected zone), extract information or material from the device/zone under protection or interfere with its operation, and then reset the NVM cell by applying a negative pulse of sufficient amplitude thereby removing any information that tampering occurred. The negative pulse could be provided from a pulse generator to the Set terminal after disconnecting the sensor from it. Then, the sensor could be reconnected. Clamp A is designed to prevent this type of intervention by a tamperer. Such a case thus especially concerns a detection device wherein the sensor circuit is not integrated with the NVM unit in a same integrated circuit.

Clamp A is also a positive clamp. If the amplitude of the stimulus pulse is too high, then damage to transistors and other on-chip devices may occur. The diode of Clamp A is designed to break down shunting charge to VSS at a given positive voltage ($V_{BREAKDOWN}$) high enough to allow a set of the NVM cell but low enough to prevent damage. It is desirable that the diode be designed and laid out to pass the charge without itself being damaged. There are many well-known design and layout techniques that can be applied from the area of electrostatic discharge (ESD) protection design. The Clamp A circuit 62 could in a different variant be formed by transistors controlled by the voltage stimulus signal in the detection mode, so as to perform the functions of Clamp A.

Clamp B is a ground clamp. Its purpose is to drive COUT to the VSS level whenever CIN is approximately 0V. CIN can be at 0V potential if the sensor outputs 0V or if CIN is not driven or connected but discharges to 0V through a reverse-biased diode like D1 in Clamp A. It is desirable that a voltage stimulus signal can be applied at any time through it to the SET input. This would allow for tamper detection during read and reset operations.

During reset, the SET input must be preferably at a stable, unalterable 0V level in order to ensure that a large enough voltage (VReset-min) can be developed to reset the NVM cell. If SET is not well-driven to 0V, then it may couple high due to parasitic coupling capacitance to high-going signals within the powered device, reducing the reset voltage below VReset-min. The same is true for a read operation in that SET must preferably be stable, unalterable, and 0V in order to provide a source of electrons for a read current or a known, stable voltage for a FET gate controlling read current. If the impedance looking towards the sensor from input pin CIN is very high, for example in the case of a sensor that collects and delivers electrostatic charge or when resetting during wafer test, then a circuit like that in Clamp B is required for successful reset and read operations under device power supply.

Figure 10:
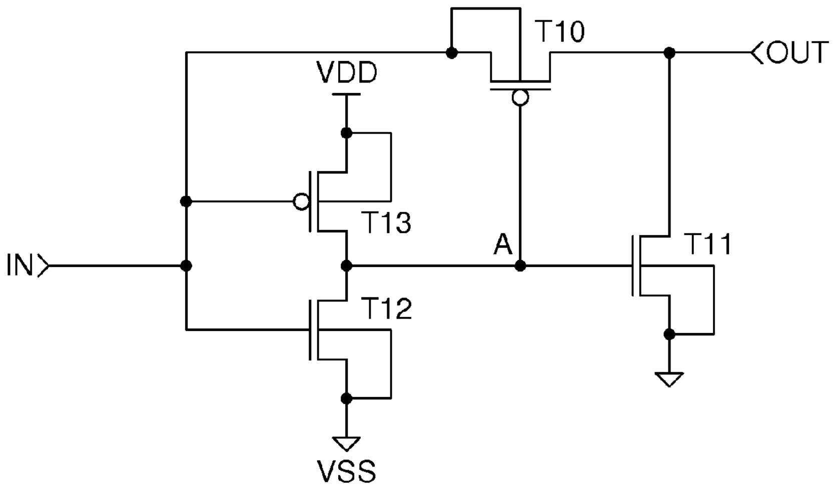
FIG. 10 shows a subcircuit of the clamp circuit of FIG. 9.

FIG. 10 is a schematic diagram of an example implementation of the Clamp B subcircuit 64 of FIG. 9. The clamp operation is as follows: For the voltage of IN (V(IN)) less than approximately VTRIP=V(VDD)/2, T13 is turned on and T12 is turned off driving node A high to turn on T11 and turn off T10 causing OUT to be driven to the VSS level (0V). For V(IN)≧VTRIP, T13 is off and T12 is on driving node A low, which turns off T11 and turns on T10 thus connecting OUT to IN.

In the case where V(VDD) is approximately 0V, OUT is not driven by T10 or T11 if IN is low. No set operation occurs when IN is low. If an external event is detected and a stimulus pulse is applied to IN, then IN goes high turning on T12 causing node A to be driven low allowing T10 to turn on while T11 is off. Therefore, the stimulus pulse is passed to the SET terminal to set the NVM cell without a power supply for the device.

A negative stimulus pulse applied to IN is clamped to a diode voltage drop by a diode existing between the N-well connection of T10 and the grounded p-type substrate preventing a reset of the NVM cell. Likewise, a reset of the NVM cell is not possible through Clamp B by driving VDD negative because there exists a diode from N-well to grounded p-substrate that prevents VDD from going negative with respect to VSS by more than a diode drop. The same diode exists for PMOS devices elsewhere whose N-well is tied to VDD.

An alternative to the Clamp B circuit of FIG. 10 is an NMOS transistor with source connected to VSS, gate connected to a read or reset control signal from the VDD power domain, and drain connected to IN and OUT that also connects to Set. The disadvantage of this last circuit is that without device power a stimulus pulse may couple the gate high enabling a current path to VSS that degrades the stimulus pulse. Another disadvantage is that the stimulus pulse cannot be passed whenever a read or reset operation is being performed.

In summary, the functions of Clamp A are:

- To pass a positive stimulus pulse for the NVM cell set operation without degradation;
- To block (clamp) negative stimulus pulse preventing a NVM cell reset operation through the CIN input terminal;
- To block (clamp) positive stimulus pulses greater than $V_{BREAKDOWN}$ thus preventing damage and a reset in the case of a PC NVM;

To accomplish pass and block functions with or without the detection device under temporary power supply.

The functions of Clamp B are:

To pass a positive stimulus pulse for NVM cell set operation without degradation (with or without device under power supply);

To Clamp SET input to ground for reliable read and reset of the NVM cell (device under power supply);

To allow a tamper detection during read and reset operations (device under power supply);

To block (clamp) negative stimulus pulse preventing NVM cell reset operation (with or without device under power supply) through the CIN input terminal.

A configuration with only Clamp A (without Clamp B) with preferably a large capacitor from SET to VSS can be functional enough for a NVFET cell with SET connected to the FET gate and for FeRAM NVM cells. A configuration with only Clamp B (without Clamp A) could be sufficient for preventing a tamperer to reset in particular a PCRAM NVM cell, if the breakdown of N-well to P+ drain of T10 is properly designed.

Hereafter, three cases of the present invention will be described where the storage means consists of a field effect transistor (FET) containing charge storage material, collectively named Non-Volatile FET (NVFET).

Figure 11:
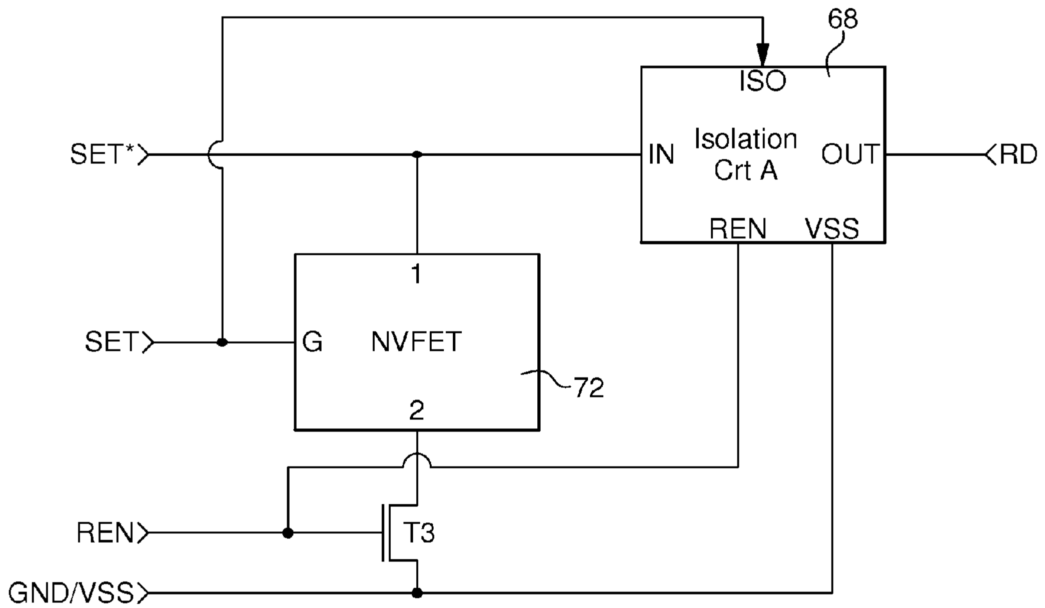
FIG. 11 shows a first embodiment of the NVM unit of FIG. 8 with a NVM cell formed by a NVFET.

FIG. 11 is a diagram of a first embodiment of the NVM unit 52 of FIG. 8 with a NVFET cell 72, where the stimulus pulse is applied to the control gate G of the NVFET. This NVFET comprises two diffusions defining its inputs 1 and 2. During the set operation (detection mode), the stimulus pulse is routed via input SET to the Gate G of the NVFET cell. At the same time, input SET * is driven low by switch 60 (FIG. 8), which in turn drives input 1 of the NVFET low. Subcircuit 68 'Isolation Crt A' isolates SET * from RD except during a read operation (read mode). Electrons are stored in the charge storage material causing the threshold voltage of NVFET to be high and current low during a read operation.

During a reset operation (reset mode), SET * is driven high causing input 1 of NVFET 72 to be driven high. At the same time, SET is driven low by subcircuit 64 'Clamp B' (FIGS. 9 & 10) driving input G low and switching off the switch 60 (FIG. 8). Electrons tunnel out of the charge storage material leaving it positively charged, reducing its threshold voltage, and causing high current to flow during a read operation. During a read operation (read mode), when no electrical stimulus pulse is present, Clamp B drives input SET low, which holds input G of NVFET 72 low, and the switch 60 (FIG. 8) is thus OFF. REN is high turning on T3 and T5 and thus connecting input 1 of the NVFET to output RD in order to allow current to flow for sensing by the read circuit (Latch circuit). For the read mode and the reset mode, the switch circuit 58 is essential in order to disconnect SET * from GND/VSS.

It is to be noted that the read output RD could, in a variant of this first embodiment, be connected to input 2 of the NVFET 72 while SET * is connected to input 1. In particular, inputs 1 and 2 in FIG. 11 can be interchanged with the SET * terminal remaining connected to input 1.

Figure 12:
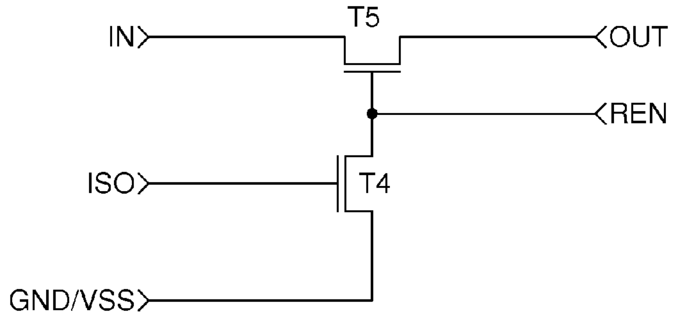
FIG. 12 shows a schematic diagram of a variant of the isolation subcircuit of FIG. 11.

FIG. 12 is a schematic diagram of an example of isolation subcircuit 68 (Isolation Crt A). During a set operation ISO is high, transistor T4 is on and the gate of transistor T5 is connected to VSS. T5 is then turned off isolating IN and OUT. This isolation operation is possible with or without a supporting supply (VDD). REN, which is in the VDD power supply domain, must be low or high-impedance (not driving) in order to not conflict with T4 driving the gate of T5 low. During a reset operation REN is low, T5 is off isolating IN and OUT. For a read operation, ISO is low because SET is low via Clamp B (FIGS. 9 & 10); REN is high causing T5 to turn on connecting OUT to IN, which allows current to flow.

Figure 13:
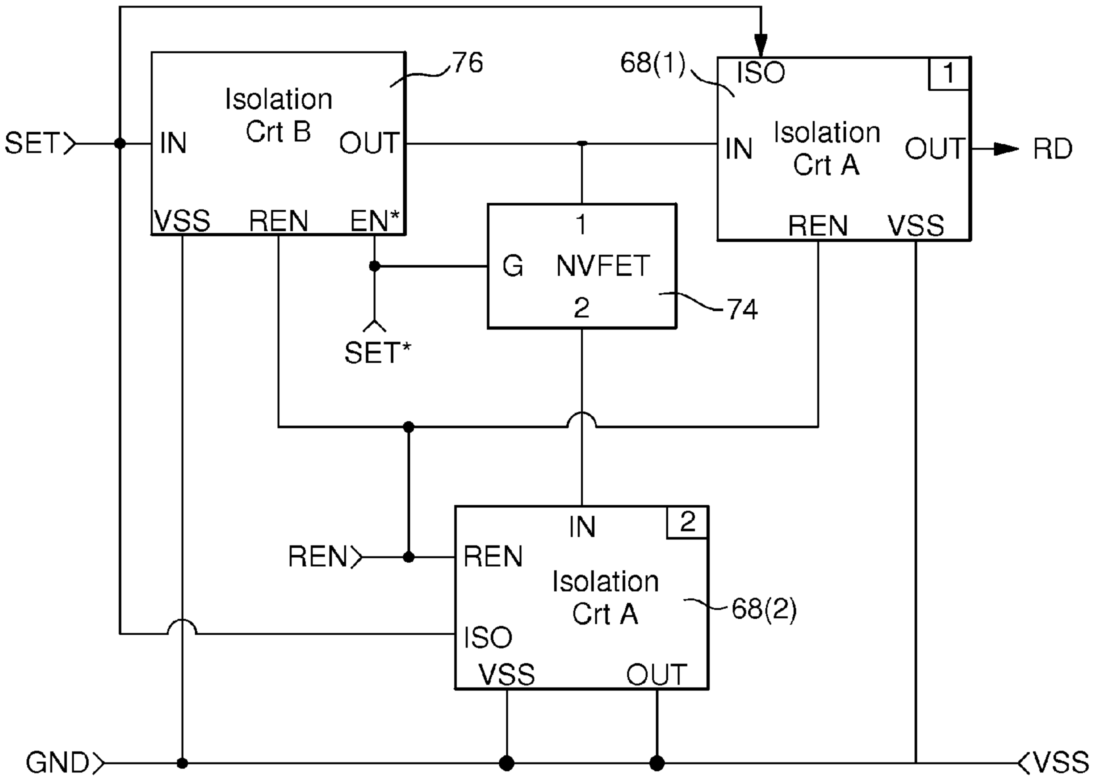
FIG. 13 shows a second embodiment of the NVM unit of FIG. 8 with a NVM cell formed by a NVFET.

FIG. 13 is a diagram of a second embodiment of the NVM unit 52 of FIG. 8 with a NVFET cell 74 having a control gate G and two diffusions defining inputs 1 and 2, where a stimulus pulse is applied to one diffusion (Input 1) of the NVFET and where the read circuit senses, i.e. the read occurs, at the same diffusion/input. During the set operation (detection mode), the stimulus pulse is routed through the subcircuit 76 'Isolation Crt B' to input 1 of NVFET 74. At the same time, SET * is driven low by transistor T2 (switch 60 of FIG. 8), which in turn drives input G of the NVFET low. Because REN is low or high impedance (not driving) and SET is high, isolation subcircuits 68(1) and 68(2) isolate IN from OUT. Both subcircuits 68(1) and 68(2) correspond to the subcircuit 68 'Isolation Crt A' shown in FIG. 12. The isolation subcircuit 68(2) prevents any leakage current through NVFET 74 that may degrade the level of the stimulus pulse routed to the diffusion. The isolation subcircuit 68(1) isolates RD from input 1 of the NVFET also to prevent degradation of the stimulus pulse routed to the diffusion.

During a reset operation, SET is driven low by Clamp B (FIGS. 9 & 10) and thus the switch 60 (FIG. 8) is OFF. At the same time SET * is driven high causing input G of NVFET 74 to be driven high. Because SET * is high, subcircuit 76 connects SET to input 1 of the NVFET, driving input 1 low. Electrons tunnel into the charge storage material leaving it negatively charged, raising its threshold voltage, and causing low current to flow during a read operation. For the reset mode, the switch circuit 58 is essential in order to disconnect SET * from GND/VSS.

During a read operation, SET * must hold input G of NVFET 74 low via the Reset line (FIG. 8). REN is high causing subcircuit 68(2) to connect input 2 of NVFET 74 to VSS in order to allow current to flow for sensing. Subcircuit 68(1) connects input 1 of NVFET to RD. Input REN causes subcircuit 76 'Isolation Crt B' to isolate SET, which is low, from input 1 of the NVFET.

Figure 14:
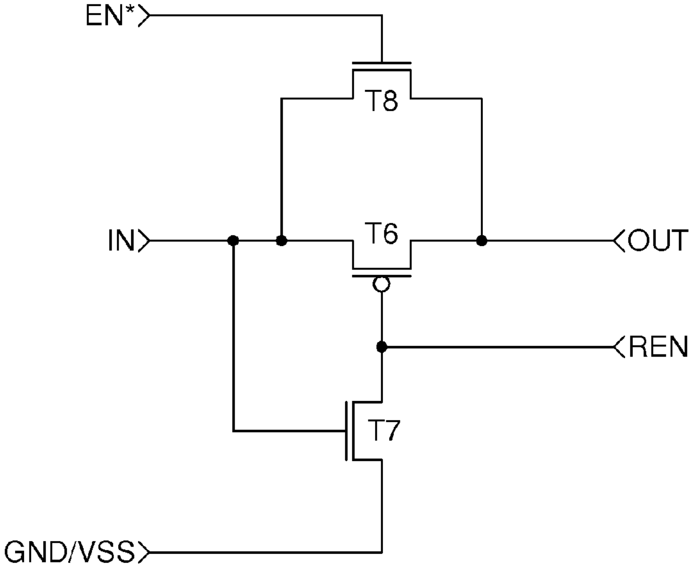
FIG. 14 shows a schematic diagram of a variant of the subcircuit 'Isolation Crt B' of FIG. 13.

FIG. 14 is a diagram of a variant of subcircuit 76 'Isolation Crt B'. Input SET must not be connected to input 1 of NVFET during a read operation, but must pass to this input 1 the voltage stimulus signal during a set operation (detection mode without power supply) and 0V during a reset operation (with power supply).

During a read operation, an alternative path for current flow must be prevented. SET * low turns off T8; REN high turns off T6; and IN low turns off T7. Therefore, OUT is isolated from IN. During a set operation, the full voltage—preferably without threshold drop—must be passed from SET to input 1 of NVFET 74. SET * low, which drives input EN *, turns off T8, and IN, which is driven by SET, is high what turns on T6 via T7. REN must be low or high-impedance (not driving) in order to not conflict with T7 driving the gate of T6 low. Therefore, a high level on SET forces IN to be connected to OUT. During a reset operation, 0V must be passed from SET to input 1 of NVFET 74. SET * high turns on T8, EN low turns on T6, and IN, which is driven by SET, is low which turns off T7. Therefore, Clamp B (FIGS. 9 & 10) drives SET low and 0V is passed from IN (input 1 of NVFET) to OUT.

Figure 15:
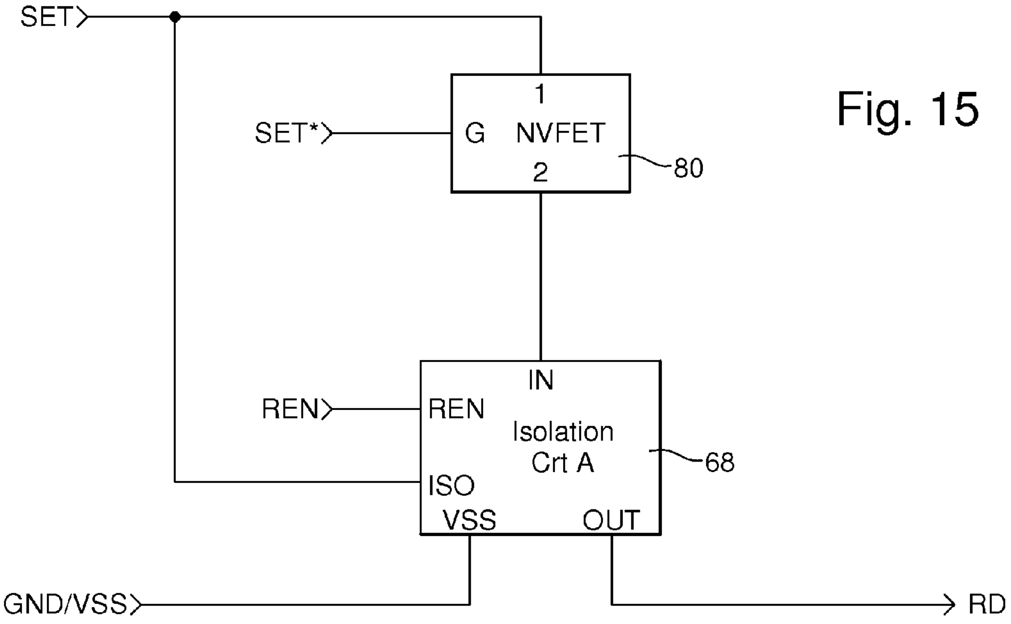
FIG. 15 shows a third embodiment of the NVM unit of FIG. 8 with a NVM cell formed by a NVFET.

FIG. 15 is a diagram of a third embodiment of a NVM unit 52 (FIG. 8) with a NVFET 80 having a control gate G and two diffusions defining inputs 1 and 2, where a stimulus pulse is applied to one diffusion (input 1) of the NVFET and where the read occurs via the other diffusion (input 2) of this NVFET. During the set operation (detection mode where no power supply is provided), the stimulus pulse is routed via input SET to input 1 of NVFET 80. At the same time, SET * is driven low by transistor T2 (switch 60), which in turn drives input G of the NVFET low. Because REN is low or high-impedance (not driving) and SET is high, the isolation subcircuit 68 isolates IN from OUT thus preventing any leakage current through the NVFET to output RD that may degrade the level of the stimulus pulse routed to the diffusion.

During a reset operation, SET is driven low by the Clamp circuit (FIG. 8), driving input 1 low, and thus switch 60 (FIG. 8) is OFF. At the same time, SET * is driven high causing input G of NVFET 80 to be driven high. Electrons tunnel into the charge storage material leaving it negatively charged, raising its threshold voltage, and causing low current to flow during a read operation. For the reset mode, the switch circuit 58 is essential in order to disconnect SET * from GND/VSS.

During a read operation, input SET * holds input G of NVFET 80 low. When no electrical stimulus pulse is present, Clamp B (FIGS. 9 & 10) drives SET low while REN is high causing subcircuit 68 to connect input 2 of the NVFET to RD in order to allow current to flow for sensing.

There are at least two compatible NVFET types which can be implemented in the first, second and third embodiments of respectively FIGS. 11, 13 and 15:

1) Floating gate; and 2) nitride-based charge storage or SONOS (polySilicon-silicon Oxide-silicon Nitride-silicon Oxide-Silicon substrate).

In the floating gate type, a polysilicon gate is sandwiched between two oxide layers which are between a polysilicon gate and a single crystal silicon substrate. The floating gate stores electrons after a high field caused by high voltage induces tunneling. The tunneling can occur a) through a tunnel oxide fabricated over one of its two diffusions, or b) through a tunnel oxide present above the region where a channel is formed (channel zone) when the device is turned on.

In the SONOS type, electrons are stored in a nitride layer positioned similarly to a floating gate. Electrons tunnel through oxide above a channel zone.

Figure 16:
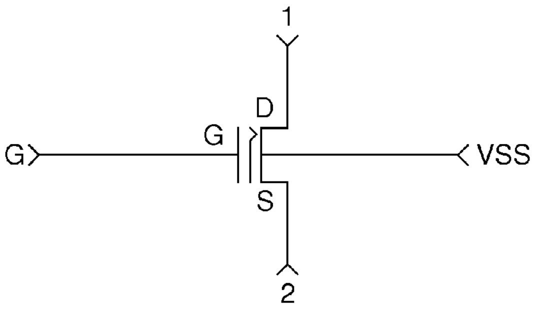
FIG. 16 shows a first configuration of a NVFET cell which can be used in the embodiments of FIGS. 11, 13 and 15.
Figure 17:
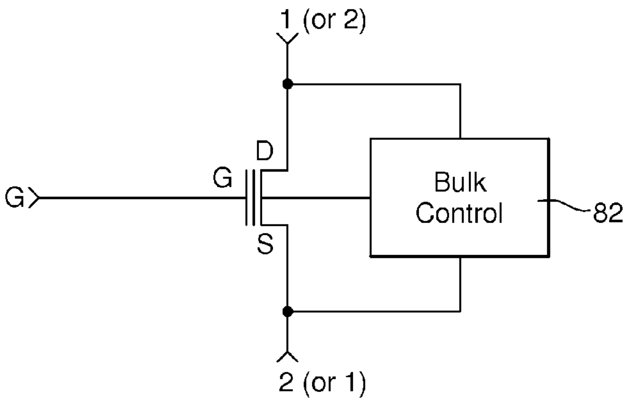
FIG. 17 shows a second configuration of a NVFET cell which can be used in the embodiments of FIGS. 11, 13 and 15.

Therefore, there are two configurations for NVFETs which can be used in the first, second and third embodiments of the NVM unit described here-above:

1) Floating gate with tunnel oxide over the drain diffusion D (input 1) as shown in FIG. 16; and 2) Floating gate with tunnel oxide over the channel zone or SONOS as shown in FIG. 17.

For the first configuration (FIG. 16), the drain D of the NVFET corresponds to input 1 (FIGS. 11, 13 and 15) and thus the source S corresponds to input 2. Because tunneling can occur anywhere along the channel for the second configuration (FIG. 17), inputs 1 and 2 (FIGS. 11, 13 and 15) may be interchanged. Thus, in the second configuration, input 1 can be the drain D or the source S of the NVFET. In this case, to erase the cell, the bulk must follow the drain and source to a high voltage and yet be connected to VSS while reading. This function requires a bulk connection control circuit 82 named 'Bulk Control'. There are well known circuits to perform this function.

In the first configuration, the same input 1 is used for setting and resetting. However, in the second configuration, input 1 or 2 can be grounded in the detection mode for setting the NVFET and the resetting operation can occur through input 1 or 2, irrespective of which input is used for the setting operation.

What is claimed is:

1. A self-powered detection device comprising:

(a) at least a non-volatile memory cell; and (b) a sensor activated by a physical or chemical action or phenomenon, wherein the sensor forms an energy harvester that transforms energy from the physical or chemical action or phenomenon into an electrical stimulus pulse, wherein the non-volatile memory cell is arranged for storing, by using the electrical power of the electrical stimulus pulse, at least a bit of information relative to detection by the sensor of at least a first physical or chemical action or phenomenon applied to the sensor with at least a given strength or intensity, wherein the non-volatile memory cell comprises a first FET transistor having i. a control gate;

ii. a first diffusion defining a first input; and iii. a second diffusion defining a second input, and wherein the first FET transistor is set to a written logical state from an initial logical state when, in a detection mode of the self-powered detection device, the non-volatile memory cell receives on a set terminal, among the control gate and the first and second inputs, a voltage stimulus signal resulting from the first physical or chemical action or phenomenon.

2. The self-powered detection device according to claim 1, wherein said set terminal is the control gate of the first FET transistor, and wherein said first input of the first FET transistor is connected to a ground potential of the sensor in said detection mode.

3. The self-powered detection device according to claim 2, wherein the first FET transistor is of a floating gate type with a tunnel oxide over a drain diffusion, and wherein said first input of the first FET transistor is the drain diffusion.

4. The self-powered detection device according to claim 3, wherein the self-powered detection device further comprises reset means or is arranged to be coupled to such reset means for resetting said non-volatile memory cell, wherein the reset means are, in a reset mode, arranged to reset the first FET transistor by applying a voltage signal of inversed polarity, relative to said voltage stimulus signal, between said control gate and said first input of the first FET transistor.

5. The self-powered detection device according to claim 4, wherein said reset means comprises a control circuit and a level shifter controlled by the control circuit.

6. The self-powered detection device according to claim 2, wherein the first FET transistor is of a floating gate type with a tunnel oxide over a channel zone or of a SONOS type, and wherein said first input of the first FET transistor is a drain of the first FET transistor or a source if the first FET transistor.

7. The self-powered detection device according to claim 6, wherein the self-powered detection device further comprises reset means or is arranged to be coupled to such reset means for resetting said non-volatile memory cell, wherein the reset means are, in a reset mode, arranged to reset the first FET transistor by applying a voltage signal of inversed polarity, relative to said voltage stimulus signal, between said control gate and said first input or said second input of the first FET transistor.

8. The self-powered detection device according to claim 7, wherein said reset means comprises a control circuit and a level shifter controlled by the control circuit.

9. The self-powered detection device according to claim 2, wherein the self-powered detection device further comprises reading means of the non-volatile memory cell or is arranged to be coupled to such reading means that are active when powered by a power source, wherein the reading means are, in a read mode, electrically connected to the first input or the second input of the first FET transistor and arranged to detect a state of the non-volatile memory cell by sensing a level of an electrical current flowing through the first input or the second input.

10. The self-powered detection device according to claim 9, wherein said reading means is formed by a latch providing at an output of the reading means a logical signal relative to the state of said first FET transistor.

11. The self-powered detection device according to claim 9, wherein an isolation circuit is provided between the first FET transistor and the reading means, wherein the isolation circuit is arranged for isolating the first FET transistor from the reading means in said detection mode and for connecting the first FET transistor to the reading means in said read mode.

12. The self-powered detection device according to claim 2, wherein the self-powered detection device further comprises a switch arranged between the ground potential of the sensor and said first input of the first FET transistor, and wherein the switch has a control gate connected to the control gate of the first FET transistor so that the first FET transistor is turned on when the voltage stimulus signal is provided to the control gate of the first FET transistor thereby connecting the first input of the first FET transistor to the ground potential.

13. The self-powered detection device according to claim 12, wherein said switch is formed by a second FET transistor having a control gate that is connected to said set terminal of said first FET transistor.

14. The self-powered detection device according to claim 1, wherein said set terminal is said first input of the first FET transistor, and wherein said control gate of the first FET transistor is connected to a ground potential of the sensor in said detection mode.

15. The self-powered detection device according to claim 14, wherein the first FET transistor is of a floating gate type with a tunnel oxide over a drain diffusion, and wherein said first input of the first FET transistor is the drain diffusion.

16. The self-powered detection device according to claim 15, wherein the self-powered detection device further comprises reset means or is arranged to be coupled to such reset means for resetting said non-volatile memory cell, wherein the reset means are, in a reset mode, arranged to reset the first FET transistor by applying a voltage signal of inversed polarity, relative to said voltage stimulus signal, between said control gate and said first input of the first FET transistor.

17. The self-powered detection device according to claim 5, wherein said reset means comprises a control circuit and a level shifter controlled by the control circuit.

18. The self-powered detection device according to claim 14, wherein the first FET transistor is of a floating gate type with a tunnel oxide over a channel zone or of a SONOS type, and wherein said first input of the first FET transistor is a drain of the first FET transistor or source of the first FET transistor.

19. The self-powered detection device according to claim 18, wherein the self-powered detection device further comprises reset means or is arranged to be coupled to such reset means for resetting said non-volatile memory cell, wherein the reset means are, in a reset mode, arranged to reset the first FET transistor by applying a voltage signal of inversed polarity, relative to said voltage stimulus signal, between said control gate and said first input or said second input of the first FET transistor.

20. The self-powered detection device according to claim 19, wherein said reset means comprises a control circuit and a level shifter controlled by the control circuit.

21. The self-powered detection device according to claim 14, wherein the self-powered detection device further comprises reading means of the non-volatile memory cell or is arranged to be coupled to such reading means that are active when powered by a power source, wherein the reading means are, in a read mode, electrically connected to the first input or the second input of the first FET transistor and arranged to detect a state of the non-volatile memory cell by sensing a level of an electrical current flowing through the first input or the second input.

22. The self-powered detection device according to claim 21, wherein said reading means is formed by a latch providing at an output of the reading means a logical signal relative to the state of said first FET transistor.

23. The self-powered detection device according to claim 21, wherein an isolation circuit is provided between the first FET transistor and the reading means, wherein the isolation circuit is arranged for isolating the first FET transistor from the reading means in said detection mode and for connecting the first FET transistor to the reading means in said read mode.

24. The self-powered detection device according to claim 14, wherein the self-powered detection device further comprises a switch arranged between the ground potential of the sensor and said control gate of the first FET transistor, and wherein the switch has a control gate connected to the set terminal of the first FET transistor so that the first FET transistor is turned on when the voltage stimulus signal is provided to the set terminal of the first FET transistor thereby connecting the control gate of the first FET transistor to the ground potential.

25. The self-powered detection device according to claim 24, wherein said switch is formed by a second FET transistor having a control gate that is connected to said set terminal of said first FET transistor.

26. The self-powered detection device according to claim 1, wherein the self-powered detection device further comprises reading means of the non-volatile memory cell or is arranged to be coupled to such reading means that are active when powered by a power source, wherein the reading means are, in a read mode, electrically connected to the first input or the second input of the first FET transistor and arranged to detect a state of the non-volatile memory cell by sensing a level of an electrical current flowing through the first input or the second input.

27. The self-powered detection device according to claim 26, wherein said reading means is formed by a latch providing at an output of the reading means a logical signal relative to the state of said first FET transistor.

28. The self-powered detection device according to claim 26, wherein an isolation circuit is provided between the first FET transistor and the reading means, wherein the isolation circuit is arranged for isolating the first FET transistor from the reading means in said detection mode and for connecting the first FET transistor to the reading means in said read mode.

29. The self-powered detection device according to claim 1, wherein said non-volatile memory cell is resetable, and wherein the self-powered detection device further comprises an OTP memory, wherein a bit of the OTP memory is automatically set when this OTP memory is powered and said non-volatile memory cell has been set to the written logical state.

30. The self-powered detection device according to claim 29, wherein said OTP memory comprises several bits that are successively set each time the non-volatile memory cell is set after a reset action.

* * * * *